United States Patent
Chen et al.

(10) Patent No.: US 9,276,006 B1
(45) Date of Patent: Mar. 1, 2016

(54) SPLIT GATE NON-VOLATILE FLASH MEMORY CELL HAVING METAL-ENHANCED GATES AND METHOD OF MAKING SAME

(71) Applicant: Silicon Storage Technology, Inc., San Jose, CA (US)

(72) Inventors: Chun-Ming Chen, New Taipei (TW); Man-Tang Wu, Hsinchu County (TW); Jeng-Wei Yang, Zhubei (TW); Chien-Sheng Su, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/589,656

(22) Filed: Jan. 5, 2015

(51) Int. Cl.
| | |
|---|---|
| *H01L 27/115* | (2006.01) |
| *H01L 21/28* | (2006.01) |
| *H01L 21/02* | (2006.01) |
| *H01L 29/45* | (2006.01) |
| *H01L 29/51* | (2006.01) |
| *H01L 29/49* | (2006.01) |
| *H01L 29/423* | (2006.01) |
| *H01L 29/788* | (2006.01) |
| *H01L 29/66* | (2006.01) |

(52) U.S. Cl.
CPC .... *H01L 27/11521* (2013.01); *H01L 21/02181* (2013.01); *H01L 21/02186* (2013.01); *H01L 21/02189* (2013.01); *H01L 21/28273* (2013.01); *H01L 29/42328* (2013.01); *H01L 29/45* (2013.01); *H01L 29/4916* (2013.01); *H01L 29/511* (2013.01); *H01L 29/517* (2013.01); *H01L 29/66825* (2013.01); *H01L 29/788* (2013.01)

(58) Field of Classification Search
CPC ............ H01L 21/28273; H01L 27/115; H01L 27/11521; H01L 27/11524; H01L 29/42328; H01L 29/66825; H01L 29/7881
See application file for complete search history.

(56) References Cited

U.S. PATENT DOCUMENTS

| | | | |
|---|---|---|---|
| 5,242,848 | A | 9/1993 | Yeh |
| 6,747,310 | B2 | 6/2004 | Fan et al. |
| 7,868,375 | B2 | 1/2011 | Liu et al. |
| 2013/0207174 | A1* | 8/2013 | Wang ................ H01L 21/28273 257/316 |
| 2014/0097482 | A1 | 4/2014 | Tokunaga et al. |

OTHER PUBLICATIONS

U.S. Appl. No. 14/589,650, filed Jan. 2015, Chen et al.

* cited by examiner

*Primary Examiner* — Kyoung Lee
(74) *Attorney, Agent, or Firm* — DLA Piper LLP (US)

(57) ABSTRACT

A non-volatile memory cell including a substrate having first and second regions with a channel region therebetween. A floating gate is disposed over and insulated from a first portion of the channel region which is adjacent the first region. A select gate is disposed over and insulated from a second portion of the channel region which is adjacent to the second region. The select gate includes a block of polysilicon material and a work function metal material layer extending along bottom and side surfaces of the polysilicon material block. The select gate is insulated from the second portion of the channel region by a silicon dioxide layer and a high K insulating material layer. A control gate is disposed over and insulated from the floating gate, and an erase gate is disposed over and insulated from the first region, and disposed laterally adjacent to and insulated from the floating gate.

12 Claims, 9 Drawing Sheets

SPLIT GATE NON-VOLATILE FLASH MEMORY CELL HAVING METAL-ENHANCED GATES AND METHOD OF MAKING SAME

TECHNICAL FIELD

The present invention relates to a non-volatile flash memory cell which has a select gate, a floating gate, a control gate, and an erase gate.

BACKGROUND OF THE INVENTION

Split gate non-volatile flash memory cells having a select gate, a floating gate, a control gate and an erase gate are well known in the art. See for example U.S. Pat. Nos. 6,747,310 and 7,868,375. An erase gate having an overhang over the floating gate is also well known in the art. See for example, U.S. Pat. No. 5,242,848. All three of these patents are incorporated herein by reference in their entirety.

Silicon dioxide has been used as a gate dielectric for select gate, also called WL (word-line), of split gate non-volatile flash memory. As flash memory cells have reduced in size, the thickness of the silicon dioxide has become thinner to increase the gate capacitance for higher current drive. However, as the select gate oxide is reduced to below 2 nm, the oxide leakage current increases significantly. As discussed below, replacing silicon dioxide with gate first, or replacement metal gate (HKMG—High-K Metal Gate) can alleviate the leakage and at the same time enhance the select gate current drive for cell read current.

Accordingly, it is one of the objectives of the present invention to improve the performance of memory cells as they continue to shrink in size.

SUMMARY OF THE INVENTION

A non-volatile memory cell comprises a substrate of a first conductivity type, having a first region of a second conductivity type, a second region of the second conductivity type spaced apart from the first region, forming a channel region therebetween, a floating gate disposed over and insulated from a first portion of the channel region which is adjacent the first region, and a select gate disposed over and insulated from a second portion of the channel region which is adjacent to the second region. The select gate comprises a block of polysilicon material, and a layer of work force metal material extending along bottom and side surfaces of the block of polysilicon material, wherein the select gate is insulated from the second portion of the channel region by a layer of silicon dioxide and a layer of high K insulating material. A control gate is disposed over and insulated from the floating gate, and an erase gate is disposed over and insulated from the first region, and disposed laterally adjacent to and insulated from the floating gate.

A method of forming a non-volatile memory cell comprises forming, in a substrate of a first conductivity type, spaced apart first and second regions of a second conductivity type, defining a channel region therebetween, forming a floating gate disposed over and insulated from a first portion of the channel region which is adjacent the first region, forming a control gate disposed over and insulated from the floating gate, forming a select gate over and insulated from a second portion of the channel region which is adjacent to the second region, and forming an erase gate disposed over and insulated from the first region, and disposed laterally adjacent to and insulated from the floating gate. The select gate comprises a block of polysilicon material, and a layer of work force metal material extending along bottom and side surfaces of the block of polysilicon material, wherein the select gate is insulated from the second portion of the channel region by a layer of silicon dioxide and a layer of high K insulating material;

Other objects and features of the present invention will become apparent by a review of the specification, claims and appended figures.

DETAILED DESCRIPTION OF THE INVENTION

Figure 1A:
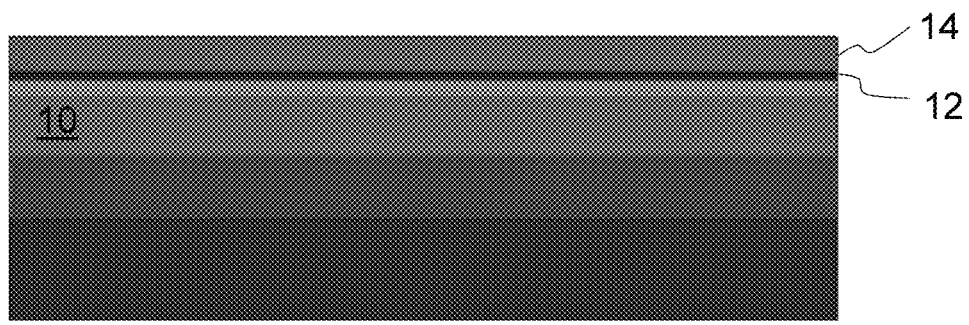
FIGS. 1A-1M are cross sectional views illustrating steps in forming the memory cell of the present invention.

Referring to FIGS. 1A-1M there are shown cross-sectional views of the steps in the process to make a memory cell with metal enhanced gates. The process begins by forming a layer of silicon dioxide (oxide) 12 on a substrate 10 of P type single crystalline silicon. Thereafter a first layer 14 of polysilicon (or amorphous silicon) is formed on the layer 12 of silicon dioxide, as illustrated in FIG. 1A. The first layer 14 of polysilicon is subsequently patterned in a direction perpendicular to the view of FIG. 1A.

Figure 1B:
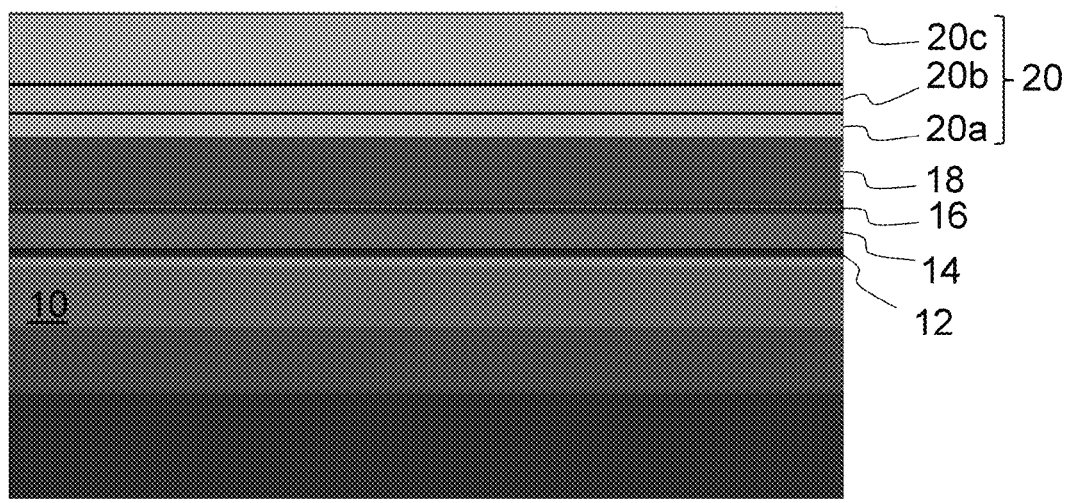

Another insulating layer 16, such as silicon dioxide (or even a composite layer, such as ONO (oxide, nitride, oxide)) is formed on the first layer 14 of polysilicon. A second layer 18 of polysilicon is then formed on the oxide layer 16. Another insulating layer 20 is formed on the second layer 18 of polysilicon and used as a hard mask during subsequent dry etching. In the preferred embodiment, the layer 20 is a composite layer, comprising silicon nitride 20a, silicon dioxide 20b, and silicon nitride 20c. The resulting structure is shown in FIG. 1B. The hard mask may be a composite layer of silicon oxide 20b and silicon nitride 20c. The hard mask may also be formed with a thick silicon nitride layer 20a.

Figure 1C:
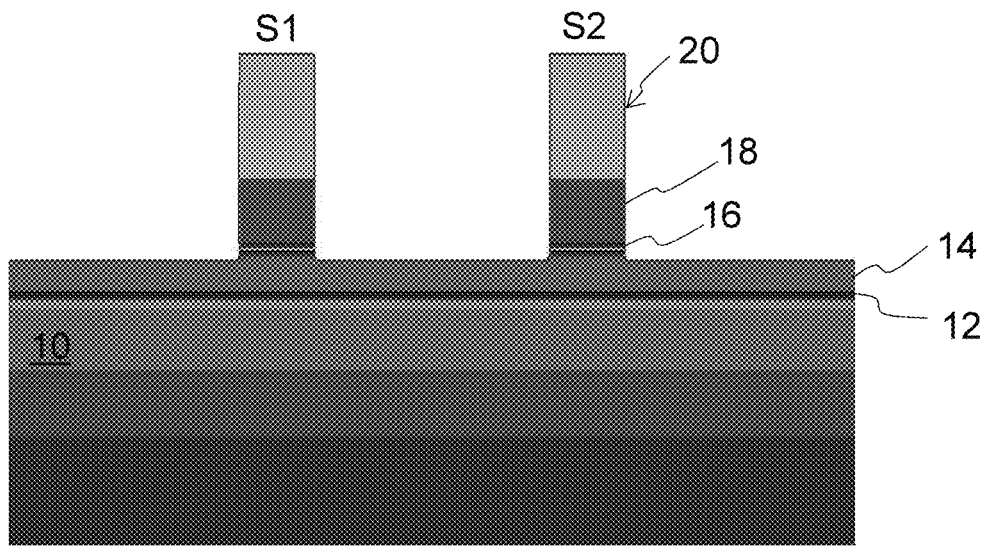

Photoresist material (not shown) is coated on the structure, and a masking step is performed exposing selected portions of the photoresist material. The photoresist is developed and using the photoresist as a mask, the structure is etched. Specifically, the composite layer 20, the second layer 18 of polysilicon, the insulating layer 16 are anisotropically etched, until the first layer 14 of polysilicon is exposed. The resultant structure is shown in FIG. 1C. Although only two "stacks": S1 and S2 are shown, it should be clear that there are a number of such "stacks" that are separated from one another.

Figure 1D:
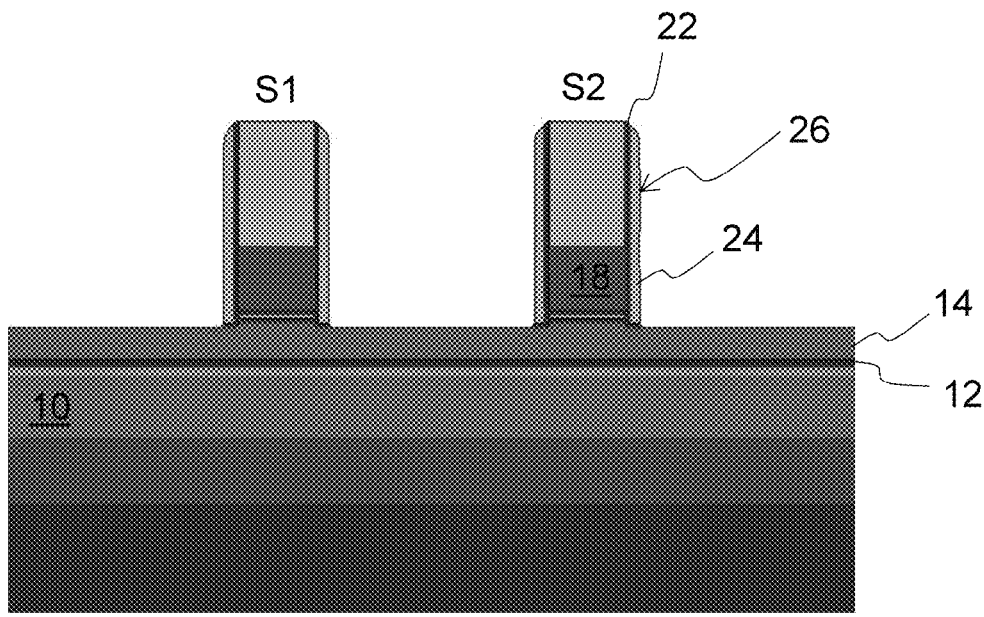

Silicon dioxide 22 is formed on the structure. This is followed by the formation of silicon nitride layer 24. The silicon nitride 24 is anisotropically etched leaving a composite spacer 26 (which is the combination of the silicon dioxide 22 and silicon nitride 24) alongside each of the stacks S1 and S2. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). The resultant structure is shown in FIG. 1D.

Figure 1E:
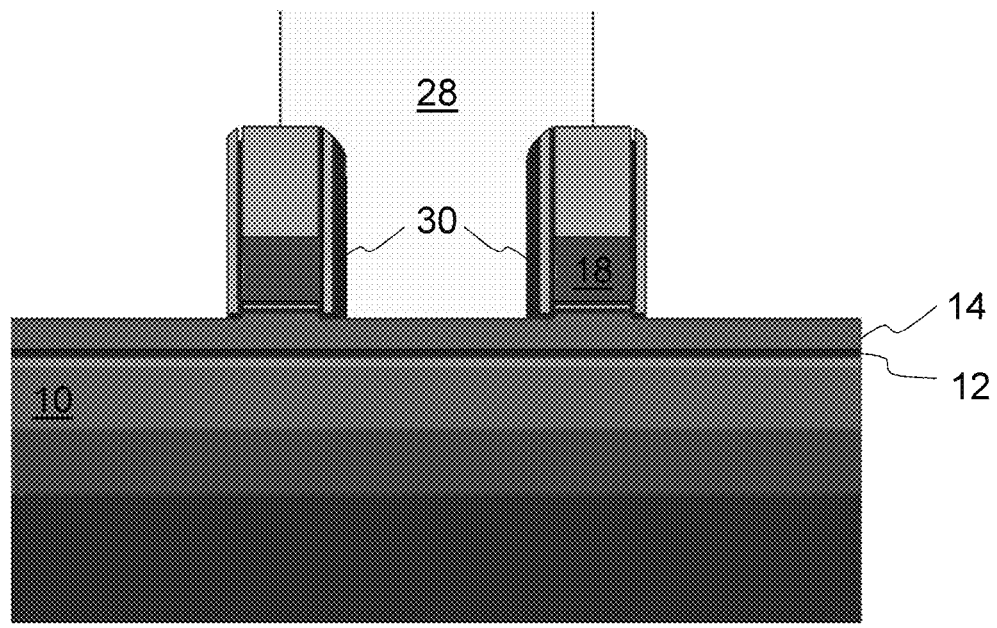

A layer of oxide is formed over the structure, followed by an anisotropical etch leaving spacers 30 of the oxide alongside the stacks S1 and S2. A photoresist 28 is formed over the regions between the stacks S1 and S2, and other alternating pairs of stacks S1 and S2. For the purpose of this discussion, the region between the pair of stacks S1 and S2 will be called the "inner region" and the regions outside of the inner region (i.e. between adjacent pairs of stacks S1 and S2) will be referred to as the "outer regions". The exposed spacers 30 in the outer regions are removed by isotropic etch. The resulting structure is shown in FIG. 1E.

Figure 1F:
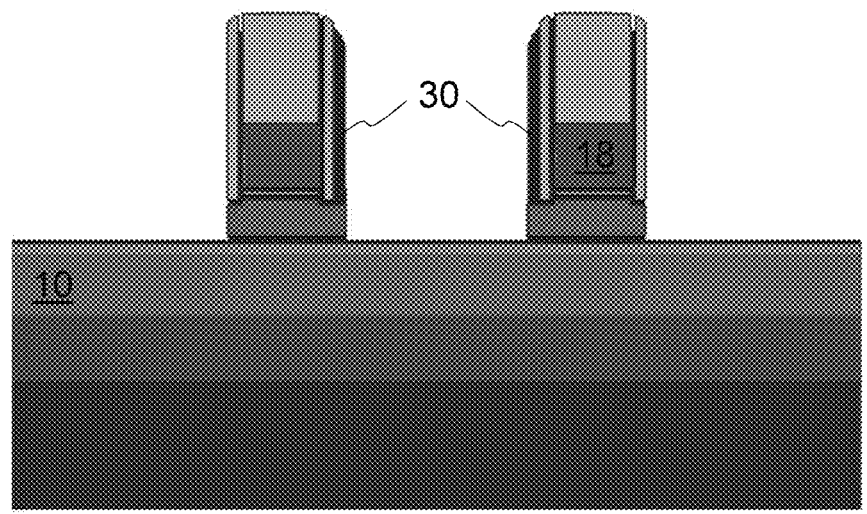

After the photoresist 28 is removed, the exposed portions first polysilicon 14 in the inner and outer regions are anisotropically etched. Part of oxide layer 12 will also be etched (removed) during the poly over-etching. A thinner layer of remaining oxide will preferably stay on the substrate 10 so as to prevent damage to the substrate 10. The resultant structure is shown in FIG. 1F.

Figure 1G:
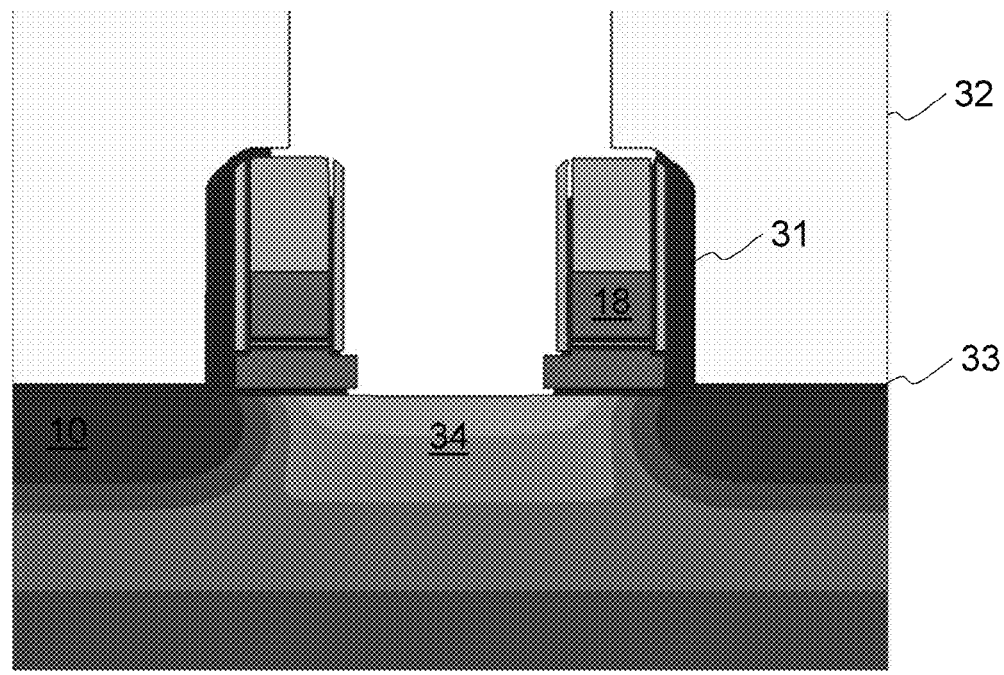

A layer of oxide is formed over the structure, followed by an anisotropical etch leaving spacers 31 of the oxide alongside the stacks S1 and S2 and a layer 33 of oxide on substrate 34. Another oxide layer is formed over the structure, thickening spacers 31 and layer 33. Photoresist material 32 is then coated and masked leaving openings in the inner regions between the stacks S1 and S2. Again, similar to the drawing shown in FIG. 1E, the photoresist is between other alternating pairs of stacks. The resultant structure is subject to an ion implant 34 (i.e. into exposed portions of substrate 10). The oxide spacers 31 adjacent to the stacks S1 and S2 and oxide layer 33 in the inner region are then removed by e.g. a wet etch. The resultant structure is shown in FIG. 1G.

Figure 1H:
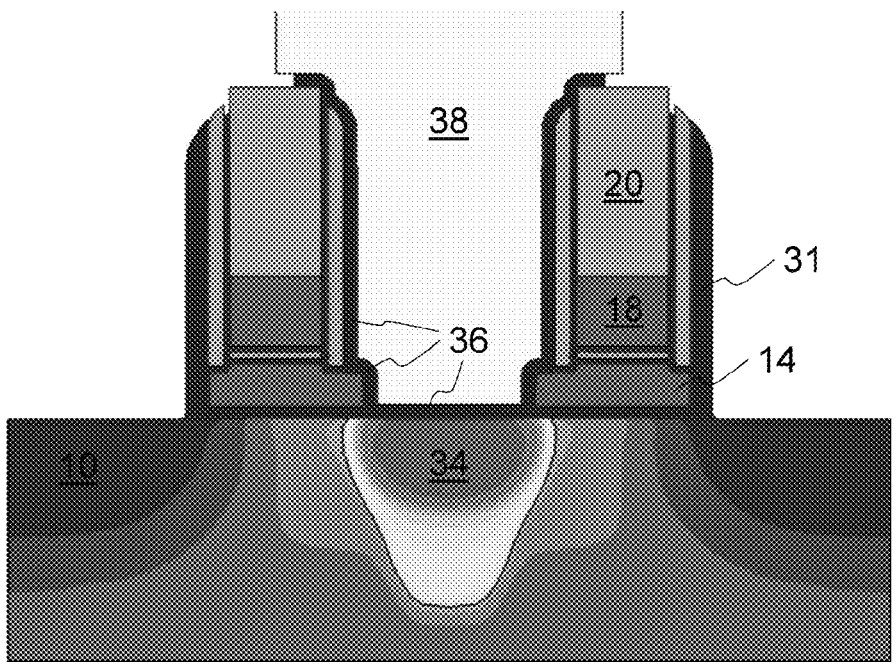

The photoresist material 32 in the outer regions of the stacks S1 and S2 is removed. A high-temperature thermal annealing step is applied to activate the ion implant 34 and to form the source junction (i.e. first or source region 34). Silicon dioxide 36 is formed everywhere. The structure is once again covered by photoresist material 38 and a masking step is performed exposing the outer regions of the stacks S1 and S2 and leaving photoresist material 38 covering the inner region between the stacks S1 and S2. An oxide anisotropical etch followed by isotropic wet etch are performed, to remove oxide 36 and oxide 33 from the outer regions of stacks S1 and S2, and possibly to reduce the thickness of the oxide spacers 31 in the outer regions of the stacks S1 and S2. The resultant structure is shown in FIG. 1H.

Figure 1I:
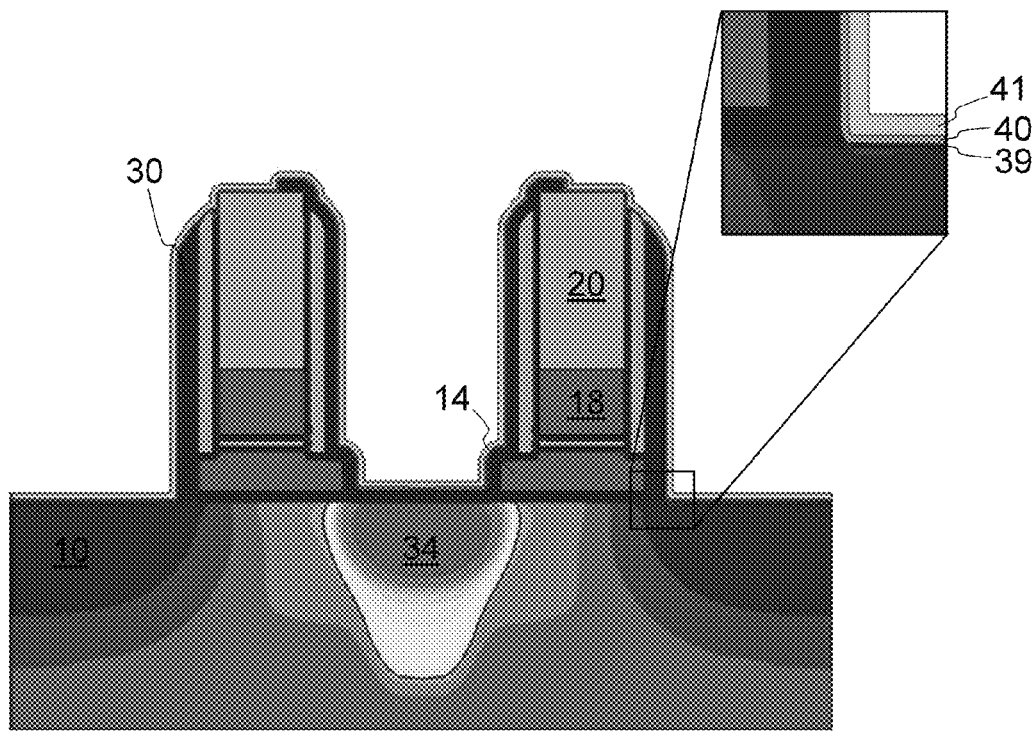

After photoresist material 38 is removed, a thin oxide layer 39 (e.g., ~0.7 to 1.0 nm) is formed as the interface layer over the structure. A second insulation layer 40 of a high K material (i.e. having a dielectric constant K greater than that of oxide, such as $HfO_2$, $ZrO_2$, $TiO_2$, etc.) is then formed over layer 39. A WF (work function) metal layer 41, such as LaOx, AlOx, is formed on layer 40 to tune the work function. The select gate threshold voltage of the split-gate flash can be adjusted through the tuning of the work function. An optional thermal treatment may follow. The resultant structure is shown in FIG. 1I.

Figure 1J:
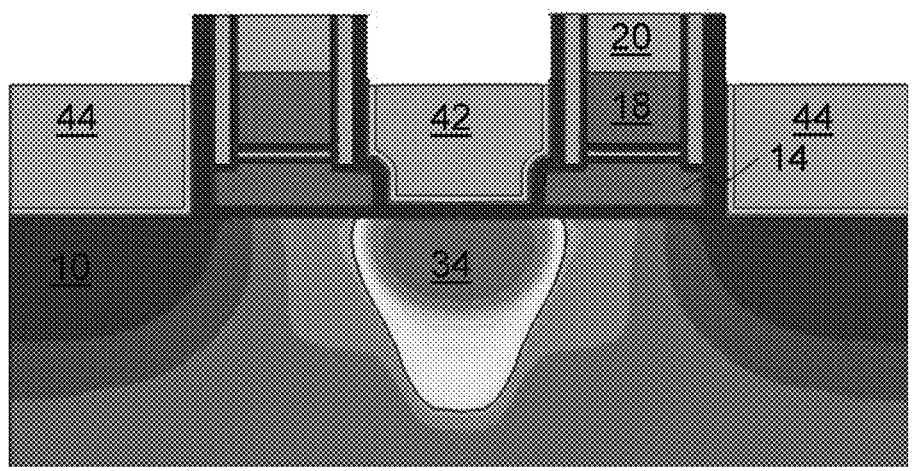

Polysilicon is then deposited over the structure, followed by a CMP etch, and further poly etch back, resulting in a block 42 of polysilicon in the inner region of the stacks S1 and S2, and blocks 44 of polysilicon in the outer regions of the stacks S1 and S2, as shown in FIG. 1J. Blocks 42 and 44 have upper surfaces recessed below hard mask 20.

Figure 1K:
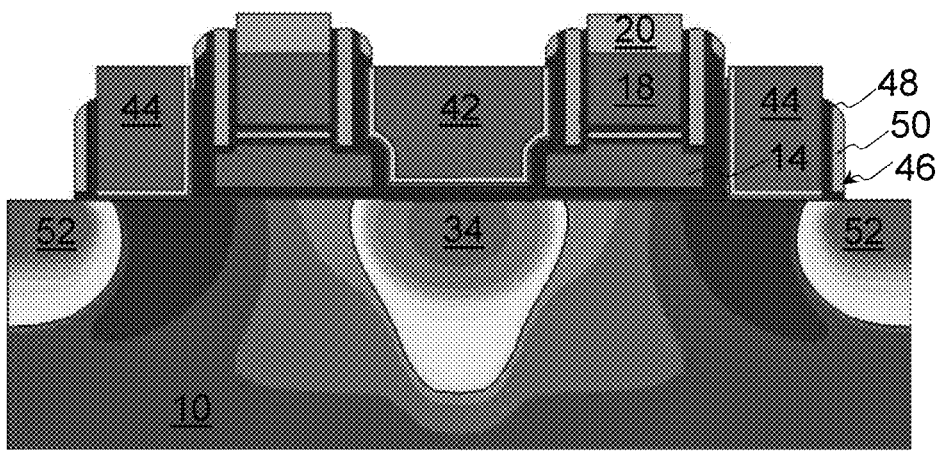

An N+ poly pre-implant may be performed. This is followed by a photoresist coating, mask exposure and selective removal, followed by selective poly etch, to remove a portion of poly blocks 44 (so that the remaining poly blocks 44 are properly sized as select gates). Further etches are performed to remove exposed portions of WF metal layer 41, high K layer 40, and oxide layer 39. An LDD implant is performed in the exposed portions of substrate 10 adjacent poly blocks 44. Oxide and nitride depositions, followed by a nitride etch, are performed to form insulation spacers 46 of oxide 48 and nitride 50 alongside poly blocks 44. An N+ implant and anneal is then performed to form second (drain) regions 52 in substrate 10. The resultant structure is shown in FIG. 1K.

Figure 1L:
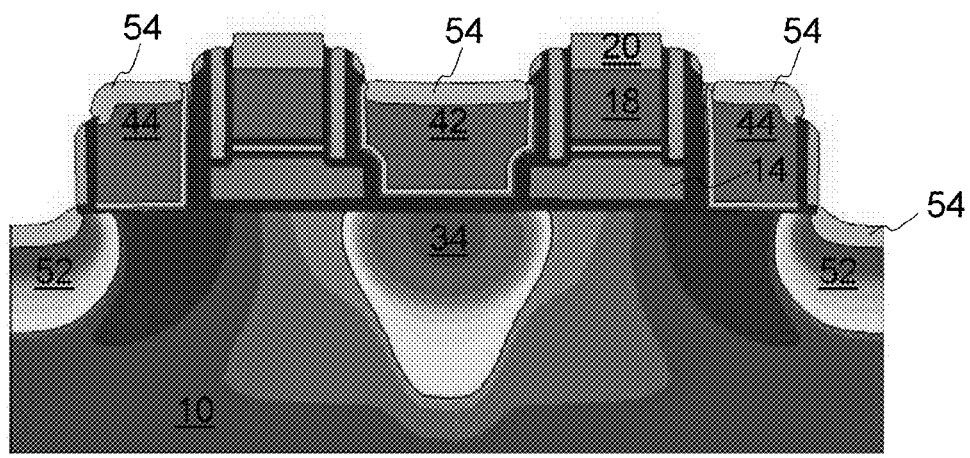

A metallization process is performed to form silicide 54 on the exposed portions substrate 10 (along surface portion of second regions 52), and on the exposed upper surfaces of poly blocks 42, 44, as illustrated in FIG. 1L. An oxide layer 56 is formed over the structure, followed by an insulation layer 66 (e.g. ILD) being formed over the structure. Contact openings are formed through the ILD layer 66 down to and exposing the silicide 54 on second regions 52 using an appropriate photo resist deposition, mask exposure, selective photo resist etch and ILD etch. The contact openings are filled with conductive material (e.g. tungsten) using an appropriate deposition and CMP etch to form electrical contacts 68. Metal contact lines 70 are then formed over ILD layer 66 and in contact with the electrical contacts 68. The resultant structure is shown in FIG. 1M.

Figure 1M:
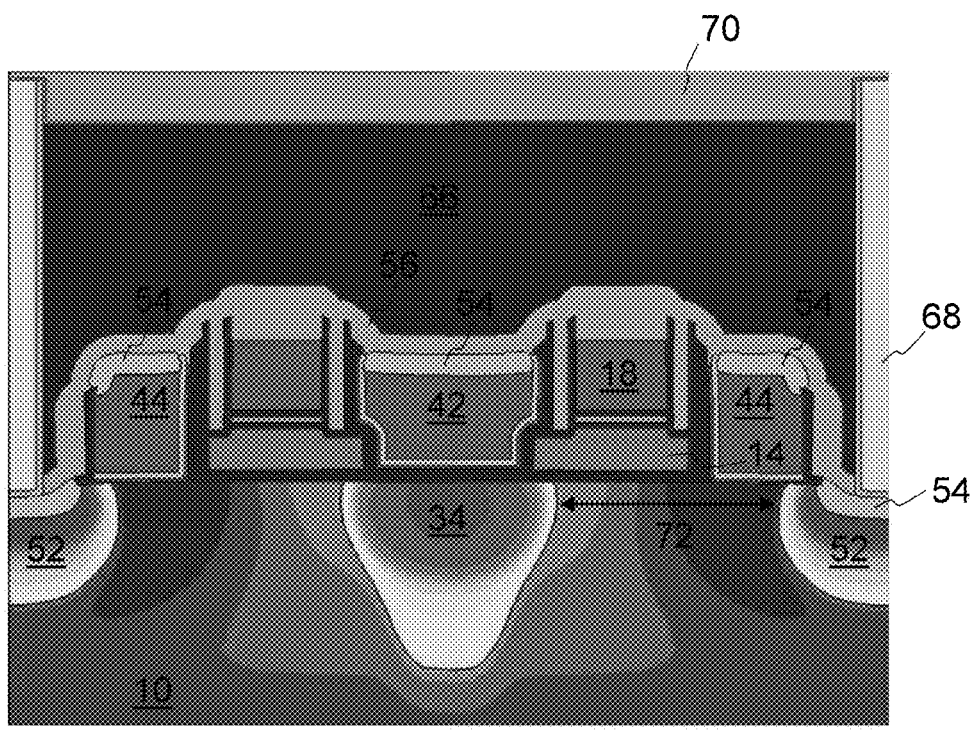

As shown in FIG. 1M, the memory cells are formed in pairs that share a common first region 34 and common erase gate 42. Each memory cell includes a channel region 72 extending between the first and second regions 34 and 52, and have a first portion disposed under the floating gate 14 and a second portion disposed under the select gate 44. The control gate 18 is disposed over the floating gate 14. By having the bottom and side surfaces of erase gates 42 and select gates 44 being lined by WF metal layer 41, and silicide 54 on the upper surfaces of gates 42 and 44, and the silicide which connects contacts 68 with second regions 52, along with the combination of oxide layer 39 and high K insulating film 40 underneath the select gates 44, the speed and performance of the memory cell is enhanced over conventional memory cells.

Figure 2A:
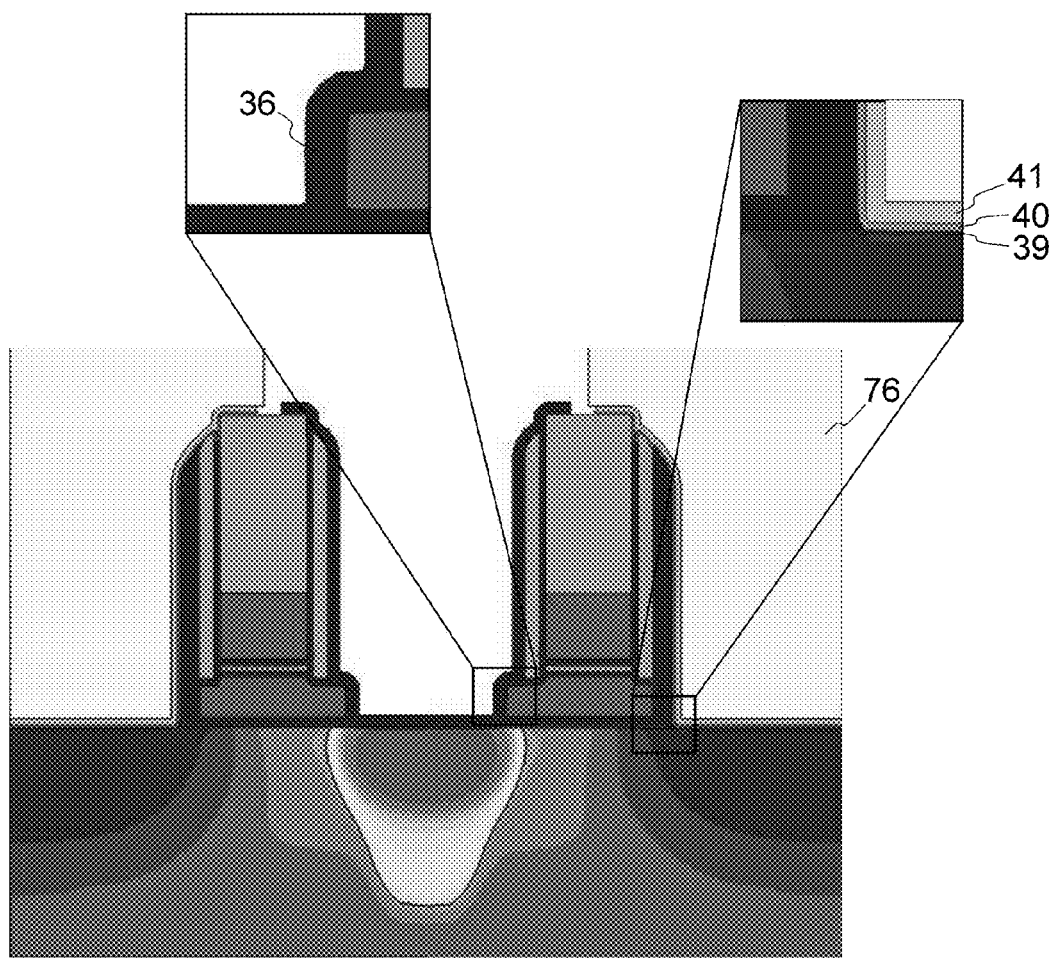
FIGS. 2A-2B are cross sectional views illustrating steps in forming an alternate embodiment of the memory cell of the present invention.
Figure 2B:
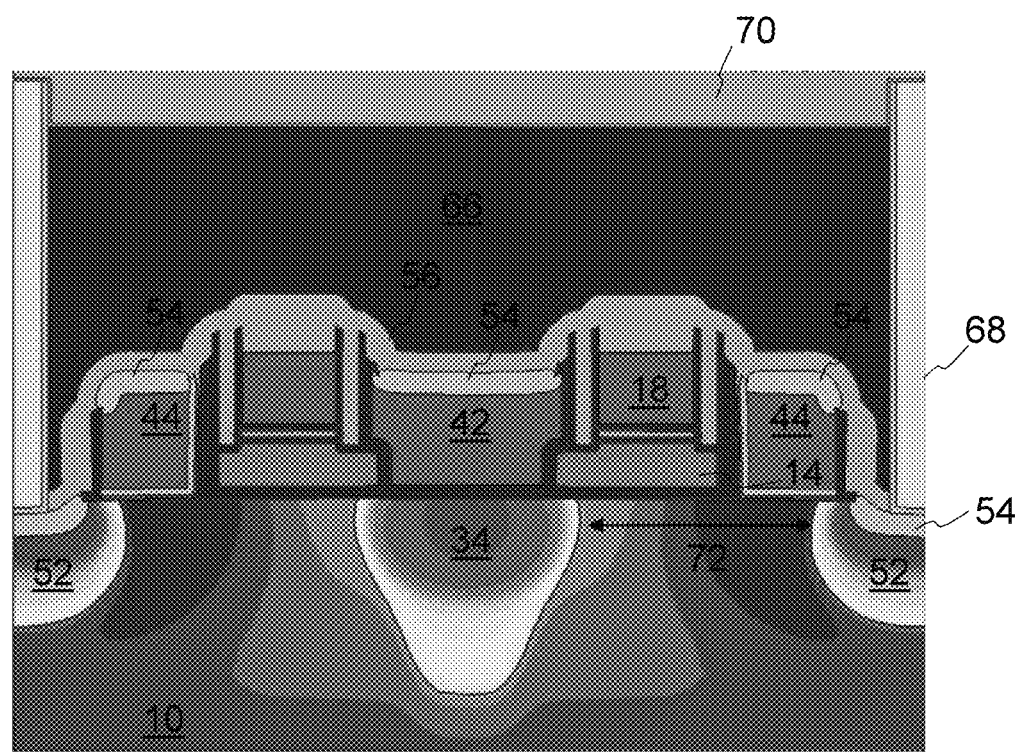

FIGS. 2A-2B illustrate an alternate embodiment where the same processing steps described above with respect to FIGS. 1A-1M are performed except where noted. Starting with the structure of FIG. 1H, and with respect to the process steps discussed above with respect to FIG. 1I, after the photoresist material 38 is removed, and after layers 39, 40, 41 are formed over the structure, photo resist 76 can be formed over the outer regions of stacks S1 and S2, whereby an etch is performed to remove the WF metal layer 41 and layer of high K material 40 in the inner region of stacks S1 and S2, (but maintains these layers underneath where the select gates will be formed), as illustrated in FIG. 2A. The remaining processing steps described above are performed, resulting in the structure of FIG. 2B. This embodiment removes the WF metal layer 41 and high K insulation layer 40 between the erase gate 42 and floating gate 14 for better control over the thickness of the tunnel oxide therebetween.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A non-volatile memory cell comprising:
    a substrate of a first conductivity type, having a first region of a second conductivity type, a second region of the second conductivity type spaced apart from the first region, forming a channel region therebetween;
    a floating gate disposed over and insulated from a first portion of the channel region which is adjacent the first region;
    a select gate disposed over and insulated from a second portion of the channel region which is adjacent to the second region, the select gate comprising:
        a block of polysilicon material, and
        a layer of work function metal material extending along bottom and side surfaces of the block of polysilicon material,
        wherein the select gate is insulated from the second portion of the channel region by a layer of silicon dioxide and a layer of high K insulating material;
    a control gate disposed over and insulated from the floating gate; and
    an erase gate disposed over and insulated from the first region, and disposed laterally adjacent to and insulated from the floating gate.

2. The memory cell of claim 1, wherein the high K insulating material is at least one of $HfO_2$, $ZrO_2$, and $TiO_2$.

3. The memory cell of claim 1, wherein the erase gate comprises:
    a second block of polysilicon material; and
    a layer of work function metal material extending along bottom and side surfaces of the second block of polysilicon material.

4. The memory cell of claim 3, further comprising:
    silicide disposed on an upper surface of the block of polysilicon material; and
    silicide disposed on an upper surface of the second block of polysilicon material.

5. The memory cell of claim 4, wherein the erase gate is insulated from the floating gate by silicon dioxide and by a layer of high K insulating material.

6. The memory cell of claim 1, further comprising:
    silicide disposed on a portion of the substrate in the second region.

7. A method of forming a non-volatile memory cell comprising:
    forming, in a substrate of a first conductivity type, spaced apart first and second regions of a second conductivity type, defining a channel region therebetween;
    forming a floating gate disposed over and insulated from a first portion of the channel region which is adjacent the first region;
    forming a control gate disposed over and insulated from the floating gate;
    forming a select gate over and insulated from a second portion of the channel region which is adjacent to the second region, the select gate comprising:
        a block of polysilicon material, and
        a layer of work function metal material extending along bottom and side surfaces of the block of polysilicon material,
        wherein the select gate is insulated from the second portion of the channel region by a layer of silicon dioxide and a layer of high K insulating material;
    forming an erase gate disposed over and insulated from the first region, and disposed laterally adjacent to and insulated from the floating gate.

8. The method of claim 7, wherein the high K insulating material is at least one of $HfO_2$, $ZrO_2$, and $TiO_2$.

9. The method of claim 7, wherein the erase gate comprises:
    a second block of polysilicon material; and
    a layer of work function metal material extending along bottom and side surfaces of the second block of polysilicon material.

10. The method of claim 9, further comprising:
    forming silicide on an upper surface of the block of polysilicon material; and
    forming silicide on an upper surface of the second block of polysilicon material.

11. The method of claim 9, wherein the erase gate is insulated from the floating gate by silicon dioxide and by a layer of high K insulating material.

12. The method of claim 7, further comprising:
    forming silicide on a portion of the substrate in the second region.

* * * * *